United States Patent
Anasako

(10) Patent No.: US 8,896,397 B2
(45) Date of Patent: *Nov. 25, 2014

(54) SURFACE ACOUSTIC WAVE DEVICE AND METHOD OF ADJUSTING LC COMPONENT OF SURFACE ACOUSTIC WAVE DEVICE

(71) Applicant: Intellectual Ventures Fund 77 LLC, Las Vegas, NV (US)

(72) Inventor: Kenichi Anasako, Tokyo (JP)

(73) Assignee: Intellectual Ventures Fund 77 LLC, Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/857,072

(22) Filed: Apr. 4, 2013

(65) Prior Publication Data
US 2013/0222079 A1 Aug. 29, 2013

Related U.S. Application Data

(63) Continuation of application No. 10/822,731, filed on Apr. 13, 2004, now Pat. No. 8,416,038.

(30) Foreign Application Priority Data

Apr. 16, 2003 (JP) .................. 2003-111296

(51) Int. Cl.
*H03H 9/64* (2006.01)
*H03H 9/05* (2006.01)
*H03H 9/52* (2006.01)
*H03H 9/00* (2006.01)

(52) U.S. Cl.
CPC . *H03H 9/64* (2013.01); *H03H 9/52* (2013.01); *H03H 9/059* (2013.01); *H03H 9/6489* (2013.01); *H03H 9/0004* (2013.01)
USPC ...... 333/193; 333/195; 310/313 B; 310/313 D

(58) Field of Classification Search
CPC ....... H03H 9/059; H03H 9/64; H03H 9/0004; H03H 9/52; H03H 9/6489
USPC ............. 333/150–152, 193–196; 310/313 B, 310/313 C, 313 D
See application file for complete search history.

(56) References Cited

U.S. PATENT DOCUMENTS 5,581,141 A  12/1996  Yamada et al.
5,786,738 A   7/1998  Ikata et al.
(Continued)

FOREIGN PATENT DOCUMENTS

JP  58-100519  6/1983
JP  60-116216  6/1985
(Continued)

OTHER PUBLICATIONS

U.S. Appl. No. 10/822,731, filed Apr. 13, 2004.
(Continued)

*Primary Examiner* — Barbara Summons
(74) *Attorney, Agent, or Firm* — Amin, Turocy & Watson, LLP

(57) ABSTRACT

A surface acoustic wave device comprises a piezoelectric substrate (1), at least one inter-digital transducers (IDT) (2) provided on the piezoelectric substrate, at least one elongated electrode pad (4) electrically connected to the IDT, and at least one stud bump (5) disposed on the electrode pad such that an LC component of the surface acoustic wave device has a predetermined value.

20 Claims, 3 Drawing Sheets

(56) References Cited

U.S. PATENT DOCUMENTS

| | | | |
|---|---|---|---|
| 6,137,380 | A | 10/2000 | Ushiroku et al. |
| 6,242,991 | B1 | 6/2001 | Nishihara et al. |
| 6,265,300 | B1 * | 7/2001 | Bhansali et al. ............... 438/612 |
| 6,268,654 | B1 * | 7/2001 | Glenn et al. ................... 257/704 |
| 6,414,415 | B1 * | 7/2002 | Shibutani et al. ......... 310/313 R |
| 6,503,820 | B1 * | 1/2003 | Shu ................................ 438/612 |
| 6,507,112 | B1 * | 1/2003 | Kurihara et al. ............. 257/734 |
| 6,552,631 | B2 | 4/2003 | Huor et al. |
| 6,577,209 | B2 | 6/2003 | Kobayashi et al. |
| 6,727,934 | B2 * | 4/2004 | Suda ............................. 347/247 |
| 6,747,530 | B1 | 6/2004 | Selmeier et al. |
| 6,765,456 | B2 | 7/2004 | Ehara et al. |
| 6,786,392 | B2 * | 9/2004 | Nogawa ...................... 228/180.5 |
| 6,879,086 | B2 * | 4/2005 | Takamine ................. 310/313 D |
| 6,882,249 | B2 * | 4/2005 | Takamine et al. ............. 333/193 |
| 6,946,950 | B1 * | 9/2005 | Ueno et al. ................... 340/10.1 |
| 6,951,047 | B2 * | 10/2005 | Tomioka et al. ............. 29/25.35 |
| 7,064,433 | B2 * | 6/2006 | Wong et al. ................... 257/737 |
| 7,116,187 | B2 | 10/2006 | Inoue et al. |
| 7,209,011 | B2 | 4/2007 | Welland et al. |
| 7,495,342 | B2 * | 2/2009 | Beaman et al. ............... 257/784 |
| 8,416,038 | B2 * | 4/2013 | Anasako ....................... 333/193 |
| 2002/0057034 | A1 * | 5/2002 | Ishikawa et al. .......... 310/313 B |
| 2003/0058066 | A1 | 3/2003 | Taniguchi et al. |

FOREIGN PATENT DOCUMENTS

| | | | | |
|---|---|---|---|---|
| JP | 62-174934 | * | 7/1987 | .................... 257/784 |
| JP | 2-306705 | | 12/1990 | |
| JP | 3-285338 | * | 12/1991 | ...................... 29/827 |
| JP | 6-164309 | | 6/1994 | |
| JP | 9-162676 | | 6/1997 | |
| JP | 11-186691 | * | 7/1999 | |
| JP | 2000-114916 | * | 4/2000 | |
| JP | 2000-156625 | * | 6/2000 | |
| JP | 2001-185977 | | 7/2001 | |
| JP | 2003-8394 | * | 1/2003 | |

OTHER PUBLICATIONS

Office Action dated Jul. 7, 2011 for U.S. Appl. No. 10/822,731, 35 pages.

Office Action dated Oct. 25, 2011 for U.S. Appl. No. 10/822,731, 8 pages.

Office Action dated May 17, 2012 for U.S. Appl. No. 10/822,731, 37 pages.

* cited by examiner

SURFACE ACOUSTIC WAVE DEVICE AND METHOD OF ADJUSTING LC COMPONENT OF SURFACE ACOUSTIC WAVE DEVICE

CROSS-REFERENCE TO RELATED APPLICATION

This application is a continuation of U.S. patent application Ser. No. 10/822,731, filed Apr. 13, 2004 and entitled "SURFACE ACOUSTIC WAVE DEVICE AND METHOD OF ADJUSTING LC COMPONENT OF SURFACE ACOUSTIC WAVE DEVICE." This application also claims the benefit of foreign application JP 2003-111296, filed on Apr. 16, 2003. The entireties of these related applications are incorporated herein by reference.

BACKGROUND OF THE INVENTION

1. Field of the Invention

The present invention relates to a surface acoustic wave device and a method of adjusting an LC component thereof, especially a surface acoustic wave device mounted on a base substrate by a stud bump and a method of adjusting an LC component thereof.

2. Description of the Related Art

A conventional surface acoustic wave (SAW) device is disclosed in, for example, Japanese Patent Application Kokai Number 2000-114916 (page 4-5 and FIGS. 1-2). In the conventional SAW device, an SAW chip containing an inter-digital transducer (IDT) is mounted on a base substrate by the flip chip mounting method. Each of the electrode pads has a top end which is provided with a bump and disposed in the center of the SAW chip. Since the bump is disposed in the vicinity of the center of the SAW chip, the stress produced by the difference in the coefficient of thermal expansion between the SAW chip and the base substrate is reduced, thus preventing wiring defective caused by heat.

In an SAW device, the characteristics of individual device are often not uniform if the thickness and shape of the IDT and the electrode pad are uneven. When the SAW device is used under high operational frequency, the influence of the uneven thickness and shape is large. Especially, in an SAW filter, such as an SAW duplexer, it is required that an LC component of the individual SAW device is adjusted to achieve a predetermined resonant frequency. However, in the SAW device disclosed in Japanese Patent Application Number 2000-114916, the position of the bump is limited to a specific area of the device so that the degree of freedom of the bump position is hot large and it is difficult to adjust the LC component of the individual SAW device and also the LC component at a specific position in the SAW device.

SUMMARY OF THE INVENTION

A surface acoustic wave device according to the present invention comprises a piezoelectric substrate, at least one IDTs, at least one electrode pad, and at least one stud bump. IDT is provided on the piezoelectric substrate and electrically connected to the electrode pad. The stud bump is disposed on the electrode pad such that the LC component of the surface acoustic wave device has a predetermined value.

The IDT is an abbreviation for inter-digital transducer and a kind of converter which converts an electrical signal to a surface acoustic wave and returns the surface acoustic wave to the electrical signal in collaboration with the piezoelectric substrate, thus transmitting the electrical signal.

According to the present invention, the stud bump is disposed on the electrode pad, adjusting the position of the disposition such that the LC component of the surface acoustic wave device has a predetermined value. In case of a plurality of IDTs provided in the device, the LC component can be adjusted for an individual IDT by adjusting the disposition position on the electrode pad connected to the individual IDT. In case that the SAW device is an SAW filter, such as an SAW duplexer, even if the resonant frequency of the SAW filter is fluctuated by the manufacturing variations, the resonant frequency can be corrected by adjusting the LC component.

BRIEF DESCRIPTION OF THE DRAWINGS

DESCRIPTION OF THE PREFERRED EMBODIMENTS (1) First Embodiment (1-1) Construction FIG. 1 is a top view of a surface acoustic wave (SAW) chip 100 according to the first embodiment of the present invention. Here, an SAW chip for an SAW duplexer, which is applicable for an antenna stage of mobile communication unit of a portable telephone, is exemplified.

The SAW chip 100 comprises IDTs 2a-2e, reflectors 3a-ah, and electrode pads 4a-4d, formed on a piezoelectric substrate 1. Stud bumps 5a-5k, which become connection portions when mounting the SAW chip 100 onto a base substrate, are provided on the electrode pads 4a-4d. The piezoelectric substrate 1 is made of a piezoelectric material, such as $LiTaO_3$, $LiNbO_3$, and quartz crystal. The IDTs 2a-2e are made of Al or an Al alloy containing a small amount of Cu. The IDTs 2a-2e are electrodes having a shape of a comb, wherein the teeth of the comb are opposed to each other. The IDTs 2a-2e convert a high frequency electrical signal to a surface acoustic wave and re-convert and output the surface acoustic wave to the high frequency electrical signal. As shown in FIG. 1, the reflectors 3a-3h are disposed at sides of the IDTs 2a-2e. For example, the reflectors 3a and 3b make surface acoustic wave generated from the IDTs 2a and 2b reflect and travel in multiple by resilient and electrical disturbing effect, thus generating standing waves by overlapping permeating waves and reflected waves. The reflectors 3c-3h are similar to the reflectors 3a and 3b. The electrode pad 4a is electrically connected to the input portion of the IDTs 2 and 2d, and the electrode pads 4b, 4c, and 4d are electrically connected to the output portions of the IDTs 2e, 2c, and 2b, respectively. The electrode pad 4a has an elongated top view having a substantially reverse "C" and the stud bumps 4b, 4c, and 4d are disposed at arbitrary positions thereof. The electrode pads 4b, 4c, and 4d have also elongated forms, respectively, and the stud bumps 5h-5k are disposed at arbitrary positions thereof. The electrode pad 4b is extended in a widthwise direction thereof too so that the position of the stud bump 5h can be selected from wide range of position in the widthwise direction. The IDTs 2a-2e, the reflectors 3e-3h, and the electrode pads 4a-4d are formed by the ordinary method of forming a metal film, which includes the processes of resist coating, exposure, and etching performed after metal sputtering. That is, the electrode pads 4a-4d can be formed through the processes of forming an electrode film, photolithography, and etching like wire bonding pads. Au balls are formed on the electrode pads 4a-4d by exclusive bonder to prove the stud bumps 5a-5k. That is the stud bumps 5a-5k are crimped on the electrode pads 4a-4d by using ultrasonic waves or heat after deciding the positions of the stud bumps 5a-5k. The stud bumps 5a-5k may be made of AuPd, Cu, and solder instead of Au.

In FIG. 4, electrode pads 4a-4d corresponding to the electrode pads 4a-4d are formed on a base substrate 20. When mounting the SAW chip 100 onto the base substrate 20, conductive paste containing solder is coated on the stud bumps 5 (5a, 5g, 5h, 5I, and 5k) or the electrode pads 4a'-4d' and the SAW chip 100 is disposed on the base substrate 20 such that the electrode pads 4a-4d mate with the electrode pads 4a'-4d', respectively. At this point, as shown by arrows in FIG. 4, the stud bumps 5 are mated with the stud bumps 5' (5a', 5g', 5h', 5i', and 5k') in the electrode pads 4a'-4d'. For simple explanation, only the stud bumps 5a, 5g, 5h, 5i, and 5k are described, however, the other stud bumps are made in the similar way. When the conductive paste becomes solid, the SAW Chip 100 and the base substrate 20 are fixed so that the electrode pads 4 are electrically connected to the electrode pads 4' through the stud bumps 5. Even when the number of connection points of the stud bumps 5 on the electrode pads 4 is increased or decreased or the connection position of the stud bumps 5 on the electrode pads 4 is changed, the SAW chip 100 can be mounted onto the base substrate 20.

Figure 1:
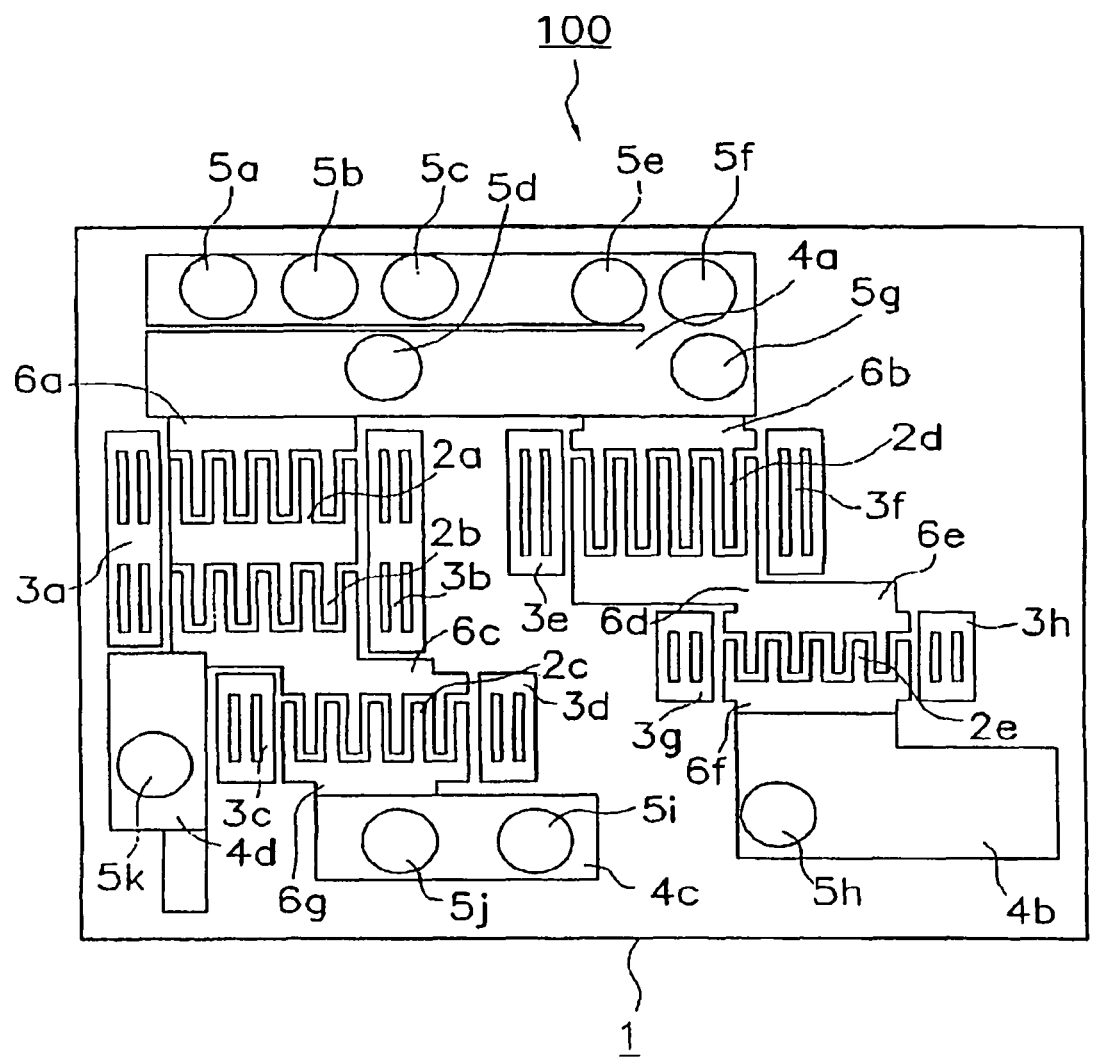
FIG. 1 is a top view of an SAW chip according to the first embodiment of the present invention.

In the above description, the reflectors 3 are provided at the sides of the IDTs 2, however, the reflectors 3 may be omitted if the internal reflection of the IDTs 2 can be used.

(1-2) Effects

If there is a wire-bonding between pads of an SAW chip and a package, the adjustment of an L component can be done by bonding one of the pads of the SAW chip to a specific pad or a plurality of pads of the package, or by disposing the pads such that the distance between the pads of the SAW chip and the package is made large. However, in case of an SAW device of flip-type mounting, wherein no wire-bonding is conducted, it has been extremely difficult to adjust the L component because the positions and the number of the stud bumps are fixed. That is, even if it is found that desired L component was not obtained by manufacturing variations after designing the layout of IDTs, electrode pads, etc., the L component can not be adjusted because of the fixed positions and number of the stud bumps. Consequently, the pattern layout must be changed.

In the SAW chip 100 according to the present invention, since the electrode pad 4 is elongated, the number of the stud bumps 5 provided in the electrode pad 4 can be increased or decreased and the stud bumps 5 are disposed at arbitrary positions so that the LC component of the SAW chip 100 can be adjusted. If the LC component is adjusted for each of the electrode pads 4a-4d, the LC component at a specific position of the SAW chip 100 can be adjusted. The LC component can be also adjusted by changing the length of an open stub, which is provided in front of each of the stud bumps 5 in the elongated electrode pad 4, by changing the positioning of the stud bumps 5. Especially, in an SAW filter, such as an SAW duplexer, the LC component can be adjusted to adjust the resonant frequency by changing the number and positions of the stud bumps 5. The characteristics of the finished product, wherein the SAW chip 100 is mounted on the base substrate 20 and packaged, are confirmed in the ordinary test after packaging to determine the optimum positions and the number of the stud bumps 5 for the mass-production.

An example of a plurality of the stud bumps 5a-5k is described in the above, however, the LC component may be adjusted by a single stud bump 5. The adjustment of the LC component by a single stud bump 5 simplifies the manufacturing process and reduces the manufacturing cost, while the adjustment of the LC component by a plurality of the stud bumps 5 increases the adjusting range of the LC component.

Since the electrode pads 4 posses the L component by themselves, the LC component can be adjusted by changing the shape and size of the wiring pattern of the electrode pads 4 without changing the positions of the stud bumps 5. Also, the adjustment range of the LC component adjustable by the positioning of the stud bumps 5 can be changed by changing the shape and size of the wiring pattern of the electrode pads 4. In addition, since there is parasitic capacitance component between the electrode pads 4 and the IDTs 2 and also there is parasitic capacitance component between the wiring patterns if the wiring patterns are insulated therebetween like the electrode pads 4a, the C component can be adjusted by changing the shape and size of the electrode pads 4.

Second Embodiment (2-1) Construction

Figure 2:
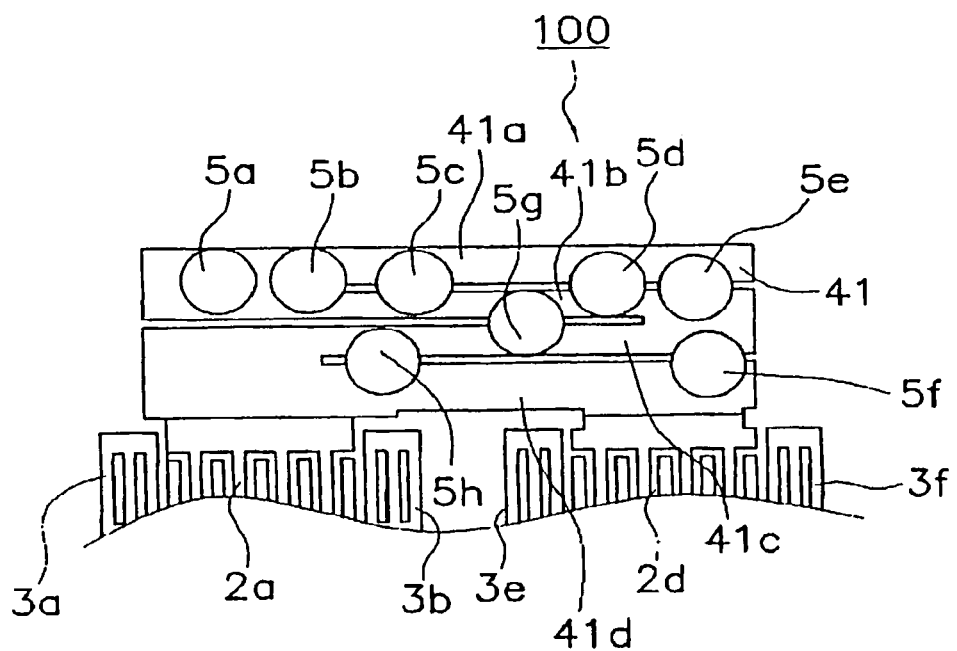
FIG. 2 is a top view of an SAW chip according to the second embodiment of the present invention.

FIG. 2 is a top view of the SAW chip 100 according to the second embodiment of the present invention. The same reference numerals are given to such elements as having the similar construction as in the first embodiment and the explanation thereof is omitted. A wiring pattern of an electrode pad 41 according to the second embodiment is snaked. The electrode pad 41 is composed of the first to fourth belt-like wiring patterns 41a-41d. The four wiring patterns 41a-41d are provided in substantially parallel to each other and the adjacent wiring patterns are connected to each other alternately at opposed ends thereof. The distance between the adjacent wiring patterns is made smaller than a diameter of the stud bumps 5. Connection portions of a plurality of wiring patterns of the electrode pad 41 are enlarged so that the stud bumps 5 can be provided at the connection portions. The entire part of the stud bump 5a is disposed in the connection portion of the electrode pad 41 and the stud bumps 5b-5h are disposed such that they are overlapped with two adjacent wiring patterns to cause a short-circuit therebetween. The number of the stud bumps 5 can be increased or decreased. Also, the stud bumps 5 can be disposed at arbitrary positions such that they are overlapped with the connection portions between the wiring patterns or two adjacent wiring patterns.

The width of the wiring pattern of the electrode pads 4 may be varied. For example, the width of the wiring pattern may be enlarged so that the entire part of the stud bump 5 is disposed in the wiring pattern.

(2-2) Effects

The positions and the number of the stud bumps 5 can be changed so that the LC component can be adjusted in the same way as in the first embodiment. Also, the wiring pattern of the electrode pads 41 is snaked and the adjacent wiring patterns are electrically short-circuited by the stud bump 5, which produces the same effect as when the L components of the wiring patterns are connected in parallel. Accordingly, the L component of impedance can be easily reduced. Also, the direct resistive component of the wiring pattern can be easily reduced by the same reason.

An example of a plurality of the stud bumps 5 is described in the above, however, the LC component may be adjusted by a single stud bump 5. The adjustment of the LC component by a single stud bump 5 simplifies the manufacturing process and reduces the manufacturing cost, while the adjustment of the LC component by a plurality of the stud bumps 5 expands the adjustment range of the LC component.

Since the electrode pads 41 possess the L component by themselves, the LC component can be adjusted by changing the shape and size of the wiring pattern of the electrode pads 41 without changing the positions of the stud bumps 5. Also, the adjustment range of the LC component adjustable by the positioning of the stud bumps 5 can be changed by changing the shape and size of the wiring pattern of the electrode pads 41. In addition, there is parasitic capacitance component between the wiring patterns disposed in substantially parallel and between the wiring patterns and the IDTs 2 so that the C component can be adjusted by changing the shape and size of the wiring patterns of the electrode pads 41.

(3) Third Embodiment (3-1) Construction

Figure 3:
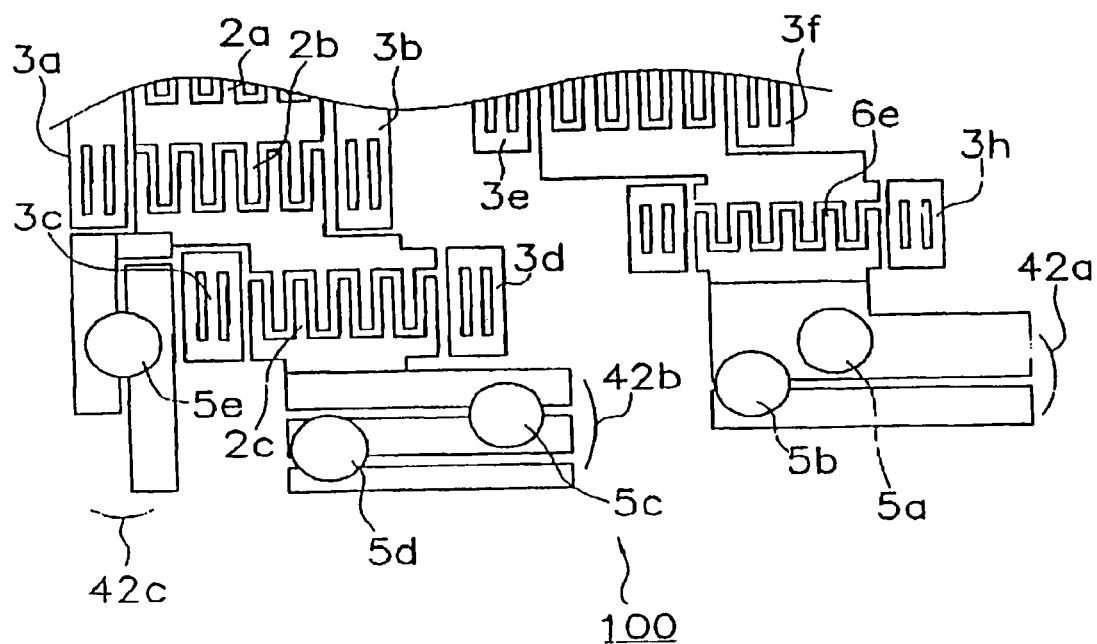
FIG. 3 is a top view of an SAW chip according to the third embodiment of the present invention.
Figure 4:
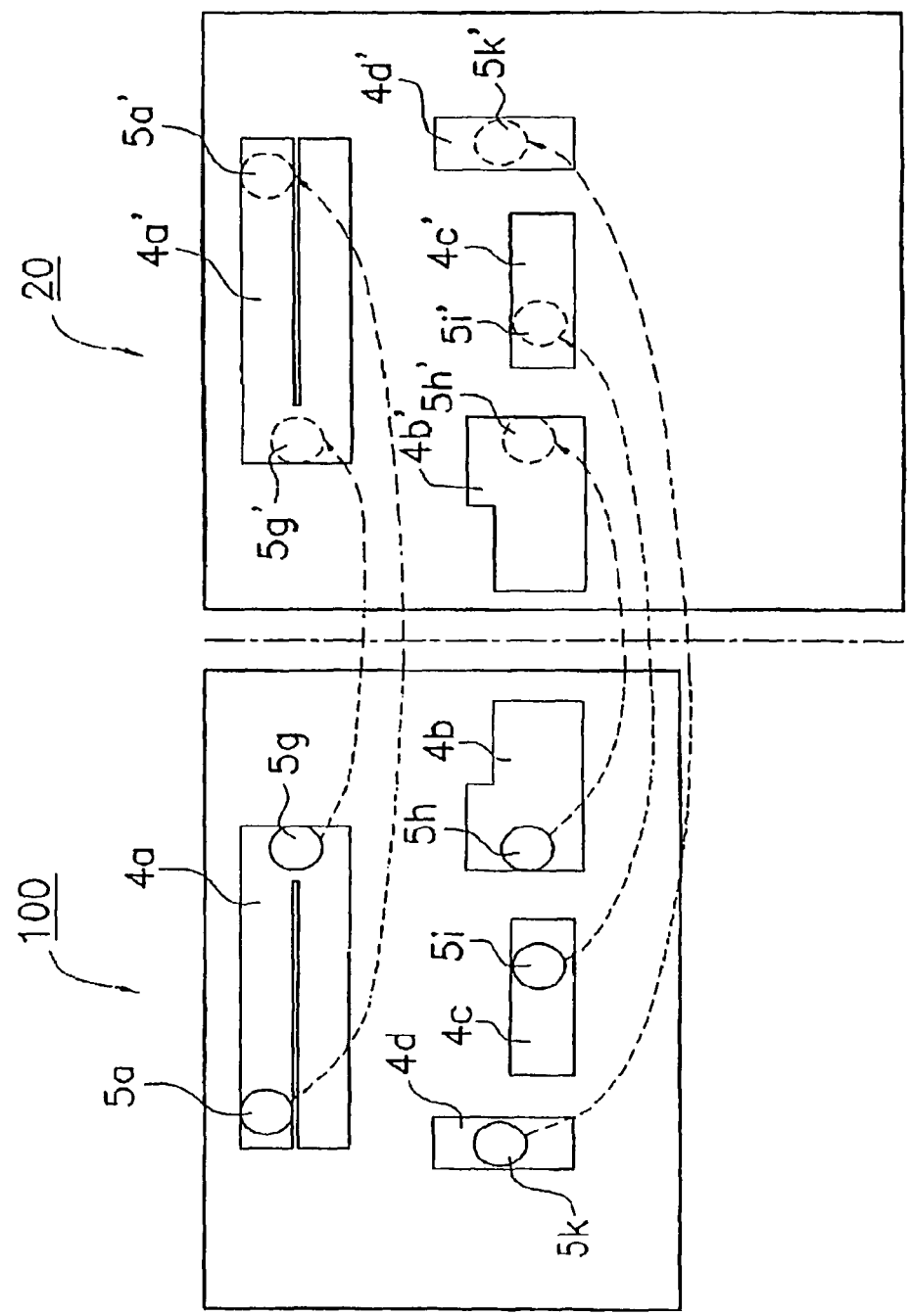
FIG. 4 is an illustration of the SAW chip showing an example of mounting the SAW onto a base substrate.

FIG. 3 is a top view of the SAW chip 100 according to the third embodiment of the present invention. The same reference numerals are given to elements having the similar construction as in the first embodiment and the explanation thereof is omitted. Electrode pads 42a-43d according to the third embodiment are composed of a plurality of island patterns which are electrically insulating therebetween. The distance between the adjacent island patterns is made smaller than a diameter of the stud bump 5. That is, the stud bump 5 can be disposed such that it is overlapped with two adjacent island patterns. The number of the stud bumps 5 provided in the respective electrode pads 42a-42c is increased or decreased. The stud bump 5 can be disposed on a single island pattern like the stud bump 5a or on two adjacent patterns like the stud bumps 5b-5e. The number of the stud bumps 5 provided in the respective electrode pads 42a-42c is determined according to the shape and size of the respective island patterns and the number of the island patterns.

(3-2) Effects

The positions and the number of the stud bumps 5 can be changed so that the LC component can be adjusted in the same way as in the first embodiment. Although it is made insulating between the respective island patterns of the electrode pads 42, the island patterns are put in the same condition as if they are connected to each other from the beginning by connecting them by the stud bumps 5. Accordingly, the degree of freedom of the electrically connected patterns according to the third embodiment is broader than that in the second embodiment, wherein the wiring patterns are connected to each other from the beginning, thus increasing the adjustment range of the LC component. Also, since it is made insulating between the island patterns, it is easier in the third embodiment than in the first and second embodiments, wherein the wiring patterns are connected to each other from the beginning, to provide open stubs without any restriction.

Since the island patterns possess the L component by themselves, the L component and direct resistive component can be adjusted by changing the shape and size of the island pattern without changing the positions of the stud bumps 5. Also, the adjustment range of the LC component adjustable by the positioning of the stud bumps 5 can be enlarged by changing the shape and size of the island pattern. In addition, there is parasitic capacitance component between the island patterns and between the island patterns and the IDTs 2 so that the C component can be adjusted by changing the shape and size of the island patterns.

According to the present invention, in a surface acoustic wave device, electrode patterns capable of electrical connection with each other at a plurality of positions are provided and stud bumps are disposed such that a desirable LC component of the surface acoustic wave device at electrode pads is obtained so that it is easy to adjust the LC component.

The invention claimed is:

1. A device, comprising:
an electrode pad comprising a first wiring pattern and a second wiring pattern connected together at a common end and electrically short-circuited by a first stud bump, wherein an entirety of a second stud bump is located on at least one of the first wiring pattern or the second wiring pattern, and the electrode pad is electrically connected to an inter-digital transducer attached to a piezoelectric substrate.

2. The device of claim 1, wherein a position of at least one of the first stud bump or the second stud bump on the electrode pad sets a value of a product of an inductance and a capacitance of the device.

3. The device of claim 1, wherein another stud bump is disposed on one of the first wiring pattern or the second wiring pattern.

4. The device of claim 1, wherein the electrode pad comprises at least three wiring patterns, including the first wiring pattern and the second wiring pattern, and wherein pairs of adjacent wiring patterns of the at least three wiring patterns are connected together at respective common ends.

5. The device of claim 1, further comprising a reflector configured to reflect a surface acoustic wave generated by the inter-digital transducer.

6. The device of claim 1, wherein the inter-digital transducer comprises a first comb-shaped inter-digital transducer positioned opposite a second comb-shaped inter-digital transducer.

7. The device of claim 1, wherein the electrode pad is a first electrode pad disposed on a surface acoustic wave chip, and wherein the first electrode pad is electrically connected to a corresponding second electrode pad disposed on a base substrate via the stud bump.

8. The device of claim 1, wherein the first wiring pattern and the second wiring pattern are substantially parallel.

9. The device of claim 1, wherein the electrode pad is elongated.

10. A method, comprising:
converting a first electrical signal to a surface acoustic wave using an electrode pad electrically connected to an inter-digital transducer attached to a piezoelectric substrate, wherein the electrode pad comprises a first wiring pattern connected to a second wiring pattern at a common end and electrically short-circuited to the second wiring pattern via a first stud bump, and an entirety of a second stud bump is disposed on at least one of the first wiring pattern or the second wiring pattern; and
converting the surface acoustic wave to a second electrical signal by the inter-digital transducer.

11. The method of claim 10, further comprising changing a value of a product of an inductance and a capacitance of a surface acoustic wave device comprising the electrode pad by moving at least one of the first stud bump or the second stud bump from a first position on the electrode pad to a second position on the electrode pad.

12. The method of claim 10, wherein the electrode pad further comprises a third wiring pattern, and wherein adjacent wiring patterns of the first wiring pattern, the second wiring pattern, and the third wiring pattern are connected at respective common ends.

13. The method of claim 10, wherein the converting the first electrical signal or the converting the surface acoustic wave comprises converting using a reflector configured to reflect the surface acoustic wave.

14. The method of claim 10, wherein the converting the first electrical signal or the converting the surface acoustic wave comprises converting using the inter-digital transducer, and wherein the inter-digital transducer comprises a first comb-shaped inter-digital transducer positioned opposite a second comb-shaped inter-digital transducer.

15. An apparatus, comprising:
means for converting an electrical signal to a surface acoustic wave;
means for conducting the electrical signal to the means for converting, wherein the means for conducting comprises a first wiring pattern connected to a second wiring pattern at a common end;
first bump means for electrically short-circuiting the first wiring pattern to the second wiring pattern; and
second bump means for setting a value of a product of an inductance and a capacitance of the apparatus, wherein the second bump means is positioned entirely on one of the first wiring pattern or the second wiring pattern.

16. The apparatus of claim 15, wherein the first bump means and the second bump means are attached to the means for conducting.

17. The apparatus of claim 15, wherein the first bump means comprises means for changing the value of the product of the inductance and the capacitance of the apparatus.

18. The apparatus of claim 15, wherein the means for converting further comprises a third wiring pattern, wherein adjacent wiring patterns of the first wiring pattern, the second wiring pattern, and the third wiring pattern are connected at respective common ends.

19. The apparatus of claim 15, further comprising means for reflecting the surface acoustic wave.

20. The apparatus of claim 15, wherein the first wiring pattern and the second wiring pattern are substantially parallel.

* * * * *